(12) United States Patent
Chang et al.

(10) Patent No.: US 8,385,877 B2
(45) Date of Patent: Feb. 26, 2013

(54) FULLY INTEGRATED COMPACT CROSS-COUPLED LOW NOISE AMPLIFIER

(75) Inventors: Yuyu Chang, Irvine, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 80 days.

(21) Appl. No.: 13/033,289

(22) Filed: Feb. 23, 2011

(65) Prior Publication Data

US 2011/0143822 A1  Jun. 16, 2011

Related U.S. Application Data

(63) Continuation of application No. 11/874,314, filed on Oct. 18, 2007, now abandoned.

(51) Int. Cl.
*H04B 1/16* (2006.01)
*H03F 3/45* (2006.01)
(52) U.S. Cl. .......... 455/341; 330/253; 330/261
(58) Field of Classification Search .......... 455/341, 455/550.1, 333, 334, 253.1; 330/253, 261, 330/311; 438/188, 60
See application file for complete search history.

(56) References Cited

U.S. PATENT DOCUMENTS

| | | | | |
|---|---|---|---|---|
| 7,176,759 | B2* | 2/2007 | Joos et al. | 330/253 |
| 7,221,218 | B2* | 5/2007 | Yang | 330/98 |
| 7,541,870 | B2* | 6/2009 | Chang et al. | 330/253 |
| 7,671,686 | B2* | 3/2010 | Kuo et al. | 330/301 |
| 7,746,169 | B2* | 6/2010 | Deng et al. | 330/254 |
| 7,839,219 | B2* | 11/2010 | Kuo et al. | 330/301 |
| 7,872,530 | B2* | 1/2011 | Phansathitwong et al. | 330/253 |
| 7,990,216 | B2* | 8/2011 | Chang et al. | 330/253 |

* cited by examiner

*Primary Examiner* — Sonny Trinh
(74) *Attorney, Agent, or Firm* — Garlick & Markison; Shayne X. Short

(57) ABSTRACT

Fully integrated compact cross-coupled low noise amplifier. A circuitry implementation that includes two pairs of metal oxide semiconductor field-effect transistors (MOSFETs) (either N-type of P-type) operates as an LNA, which can be used within any of a wide variety of communication devices. A majority of the elements are integrated within the design and need not be implemented off-chip, and this can provide for a reduction in area required by the circuitry. A differential 100Ω input impedance is provided by this design. A higher than typical power supply voltage can be employed (if desired) to accommodate one possible implementation that includes two parallel implemented resistors to ground.

18 Claims, 6 Drawing Sheets

US 8,385,877 B2

FULLY INTEGRATED COMPACT CROSS-COUPLED LOW NOISE AMPLIFIER

CROSS REFERENCE TO RELATED PATENTS/PATENT APPLICATIONS

Continuation priority claim, 35 U.S.C. §120 The present U.S. Utility patent application claims priority pursuant to 35 U.S.C. §120, as a continuation, to the following U.S. Utility patent application which is hereby incorporated herein by reference in its entirety and made part of the present U.S. Utility patent application for all purposes:

1. U.S. Utility patent application Ser. No. 11/874,314, entitled "Fully integrated compact cross-coupled low noise amplifier,", filed Oct. 18, 2007, pending.

INCORPORATION BY REFERENCE

The following U.S. Utility patent application is hereby incorporated herein by reference in its entirety and made part of the present U.S. Utility patent application for all purposes:

1. U.S. Utility patent application Ser. No. 11/874,305, entitled "Cross-coupled low noise amplifier for cellular applications," filed Oct. 18, 2007, now U.S. Pat. No. 7,541,870, issued on Jun. 2, 2009.

BACKGROUND OF THE INVENTION

1. Technical Field of the Invention

The invention relates generally to communication systems; and, more particularly, it relates to integration of components within communication devices employed within such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

While transmitters generally include a data modulation stage, one or more IF stages, and a power amplifier, the particular implementation of these elements is dependent upon the data modulation scheme of the standard being supported by the transceiver. For example, if the baseband modulation scheme is Gaussian Minimum Shift Keying (GMSK), the data modulation stage functions to convert digital words into quadrature modulation symbols, which have a constant amplitude and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with a transmit power level setting to produce a phase modulated RF signal.

As another example, if the data modulation scheme is 8-PSK (phase shift keying), the data modulation stage functions to convert digital words into symbols having varying amplitudes and varying phases. The IF stage includes a phase locked loop (PLL) that generates an oscillation at a desired RF frequency, which is modulated based on the varying phases produced by the data modulation stage. The phase modulated RF signal is then amplified by the power amplifier in accordance with the varying amplitudes to produce a phase and amplitude modulated RF signal.

As yet another example, if the data modulation scheme is x-QAM (16, 64, 128, 256 quadrature amplitude modulation), the data modulation stage functions to convert digital words into Cartesian coordinate symbols (e.g., having an in-phase signal component and a quadrature signal component). The IF stage includes mixers that mix the in-phase signal component with an in-phase local oscillation and mix the quadrature signal component with a quadrature local oscillation to produce two mixed signals. The mixed signals are summed together and filtered to produce an RF signal that is subsequently amplified by a power amplifier.

As the desire for wireless communication devices to support multiple standards continues, recent trends include the desire to integrate more functions on to a single chip. However, such desires have gone unrealized when it comes to implementing baseband and RF on the same chip for multiple wireless communication standards. In addition, many components and/or modules within the components employed within such communication devices and wireless communication devices include many off-chip elements.

FIG. 4 is a diagram illustrating an embodiment 400 of a prior art implementation of an LNA. An input voltage, Vin, is provided across an input inductor (L3) and then to two separate capacitors, C1 and C2. The outputs from these two separate capacitors, C1 and C2, are provided to two other capacitors, C3 and C4, and subsequently to the gates of a first pair of transistors (M1 and M2). A second pair of transistors (M3 and M4) is implemented such that the drains of the first pair of transistors (M1 and M2) are coupled to the sources of the second pair of transistors (M3 and M4). The gates of the second pair of transistors (M3 and M4) are provided a bias voltage level (Vbias2). Two separate resistors, R1 and R2, are connected between the gates of the first pair of transistors (M1 and M2) and another bias voltage level (Vbias1). Two separate inductors, L1 and L2, are connected between the drains of the second pair of transistors (M3 and M4) to a power supply voltage level (Vdd0). Two source inductors are connected between the sources of the first pair of transistors (M1 and M2) to ground. As can also be seen, the node between capacitor, C1, and capacitor, C3, is connected to the source of one transistor (M2) within the pair of transistors (M1 and M2), and the node between capacitor, C2, and capacitor, C4, is connected to the source of the other transistor (M1) within the first pair of transistors (M1 and M2). If desired, shunt capacitors can be implemented as well as depicted in the diagram (e.g., using dotted lines). For example, one shunt capacitor can be implemented each of the sides of capacitor, C1, and capacitor, C2, respectively.

This prior art approach provides a relatively high linearity. It also provides a wide 50Ω input impedance matching bandwidth, as well as a good noise figure while maintaining relatively low power consumption. However, this prior art approach also requires off-chip source inductors for providing a better noise figure. The use of on-chip source inductors generally does not provide a good noise performance. Moreover, a relatively large number of off-chip components (e.g., 5 including 2 capacitors [C1, C2], 2 source inductors, and 1 input indictor) generally leads to a higher manufacturing cost than is desirable, and this also leads to a higher form factor (e.g., a larger device occupying larger real estate). These off-chip components are also depicted using a dashed line.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel design of implementing an LNA (Low Noise Amplifier) using two pairs of metal oxide semiconductor field-effect transistors (MOSFETs) (either N-type of P-type) is presented herein. Such an LNA can be used within any of a wide variety of communication devices. A majority of the elements within this novel approach are integrated and need not be implemented off-chip. This can provide for a reduction in area required by the circuitry when compared to prior art approaches. A differential 100Ω input impedance is provided by this design. In one possible embodiment, a higher than typical power supply voltage can be employed to ensure a higher voltage gain and lower noise figure.

When compared to at least one prior art approach, the number of off-chip components is reduced from five off-chip components (in the prior art approach) to only one off-chip component (in the novel design presented herein). This provides for a lower cost than prior art approaches as well as a smaller form factor thereby providing for much improved integration than prior approaches.

Figure 5:
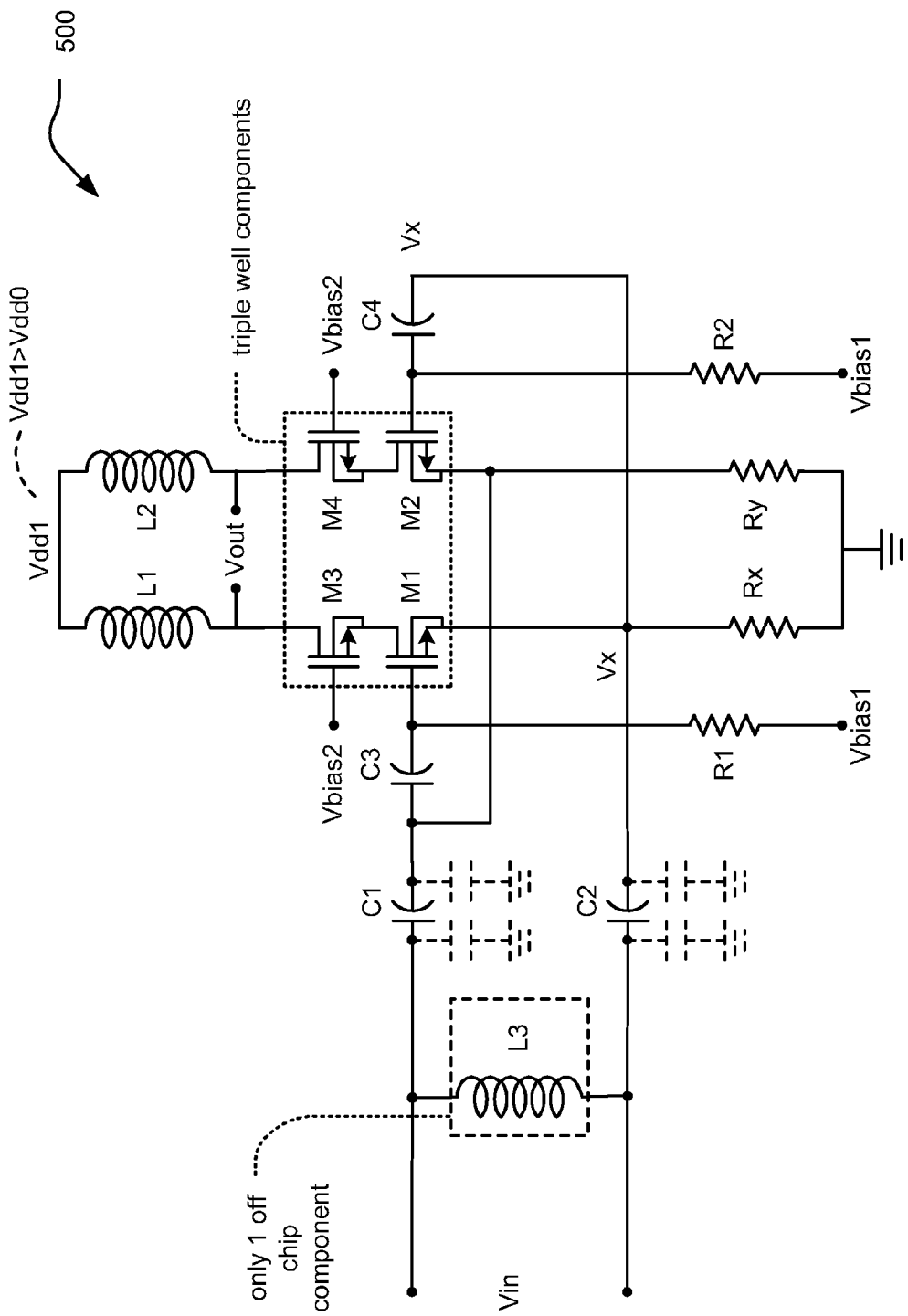
FIG. 5 and FIG. 6 are diagrams illustrating embodiments of LNAs.

From one perspective, when compared and contrasted to the prior art approach, two source inductors within the prior art approach are replaced with two resistors (e.g., Rx and Ry in FIG. 5) or two current sources (e.g., in FIG. 6) thereby obviating the two source inductors within the prior art approach. In the embodiment of FIG. 5, a higher that typical power supply voltage (e.g., use Vdd1 where Vdd1>Vdd0, and where Vdd0 is the typical power supply voltage) can be employed to ensure a higher voltage gain and lower noise figure.

In addition, when compared and contrasted to the prior art approach, the novel design presented herein employs MOSFETs connected in the triple well (or sometimes referred to as 'tri-well') (e.g., where the source is connected to the substrate of the MOSFET). This enables the well connections of these MOSFETs to their own source terminals. This also avoids the time dependent dielectric breakdown (TDDB) and hot carrier damage due to the use of the high supply voltage.

Figure 6:
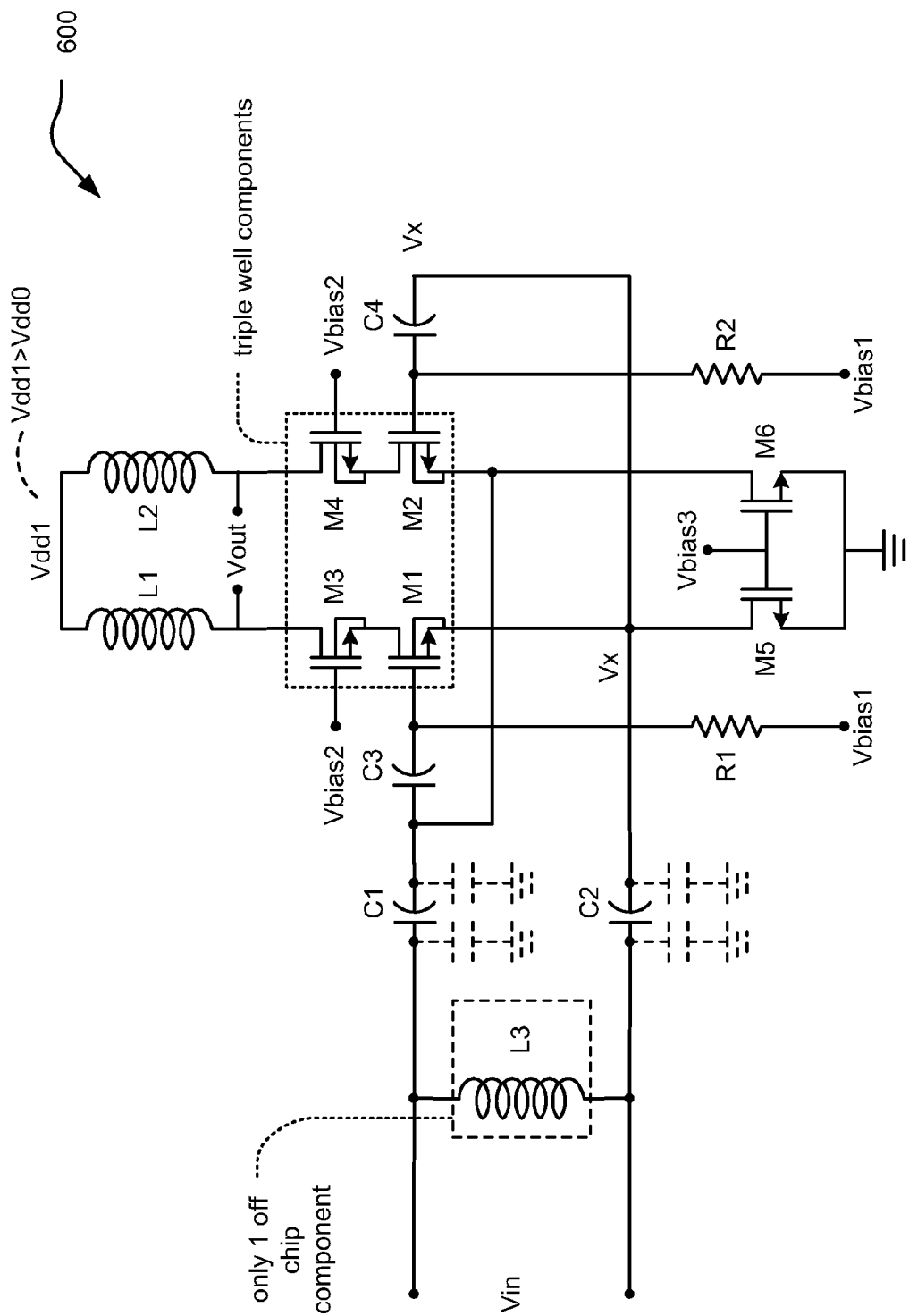

Moreover, when compared and contrasted to the prior art approach, the novel design presented herein integrates two capacitors of the prior art approach on-chip (e.g., C1 and C2 in FIG. 5 and FIG. 6).

Figure 1:
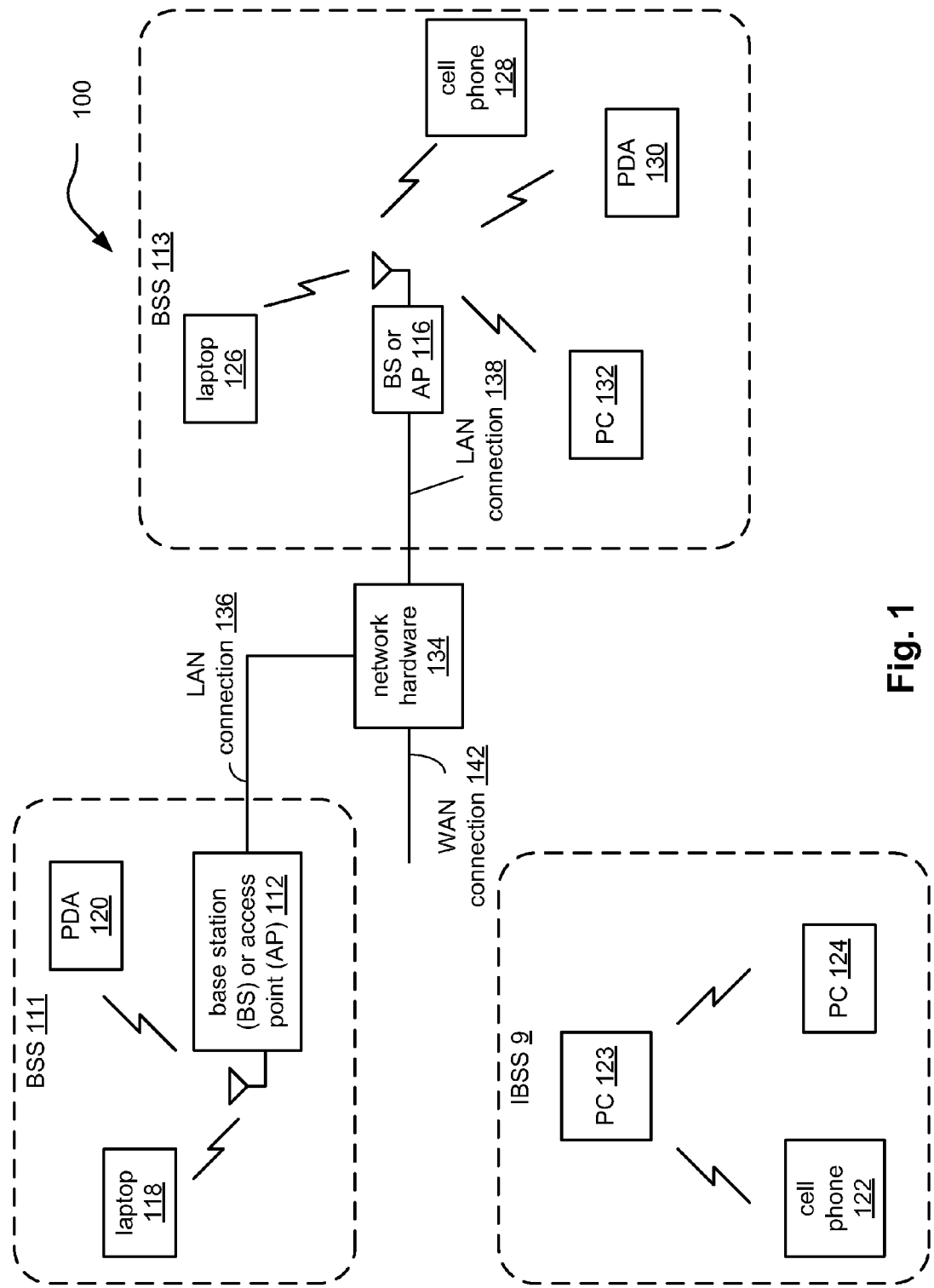
FIG. 1 is a diagram illustrating an embodiment of a wireless communication system.

FIG. 1 is a diagram illustrating an embodiment of a wireless communication system 100. The wireless communication system 100 includes a plurality of base stations and/or access points 112, 116, a plurality of wireless communication devices 118-132 and a network hardware component 134. Note that the network hardware 134, which may be a router, switch, bridge, modem, system controller, et cetera provides a wide area network connection 142 for the communication system 100. Further note that the wireless communication devices 118-132 may be laptop host computers 118 and 126, personal digital assistant hosts 120 and 130, personal computer hosts 124 and 132 and/or cellular telephone hosts 122 and 128.

Wireless communication devices 122, 123, and 124 are located within an independent basic service set (IBSS) area and communicate directly (i.e., point to point). In this configuration, these devices 122, 123, and 124 may only communicate with each other. To communicate with other wireless communication devices within the system 100 or to communicate outside of the system 100, the devices 122, 123, and/or 124 need to affiliate with one of the base stations or access points 112 or 116.

The base stations or access points 112, 116 are located within basic service set (BSS) areas 111 and 113, respectively, and are operably coupled to the network hardware 134 via local area network connections 136, 138. Such a connection provides the base station or access point 112-116 with connectivity to other devices within the system 100 and provides connectivity to other networks via the WAN connection 142. To communicate with the wireless communication devices within its BSS 111 or 113, each of the base stations or access points 112-116 has an associated antenna or antenna array. For instance, base station or access point 112 wirelessly communicates with wireless communication devices 118 and 120 while base station or access point 116 wirelessly communicates with wireless communication devices 126-132. Typically, the wireless communication devices register with a particular base station or access point 112, 116 to receive services from the communication system 100.

Typically, base stations are used for cellular telephone systems (e.g., advanced mobile phone services (AMPS), digital AMPS, global system for mobile communications (GSM), code division multiple access (CDMA), local multi-point distribution systems (LMDS), multi-channel-multi-point distribution systems (MMDS), Enhanced Data rates for GSM Evolution (EDGE), General Packet Radio Service (GPRS), high-speed downlink packet access (HSDPA), high-speed uplink packet access (HSUPA and/or variations thereof) and like-type systems, while access points are used for in-home or in-building wireless networks (e.g., IEEE 802.11, Bluetooth, ZigBee, any other type of radio frequency based network protocol and/or variations thereof). Regardless of the particular type of communication system, each wireless communication device includes a built-in radio and/or is coupled to a radio.

Figure 2:
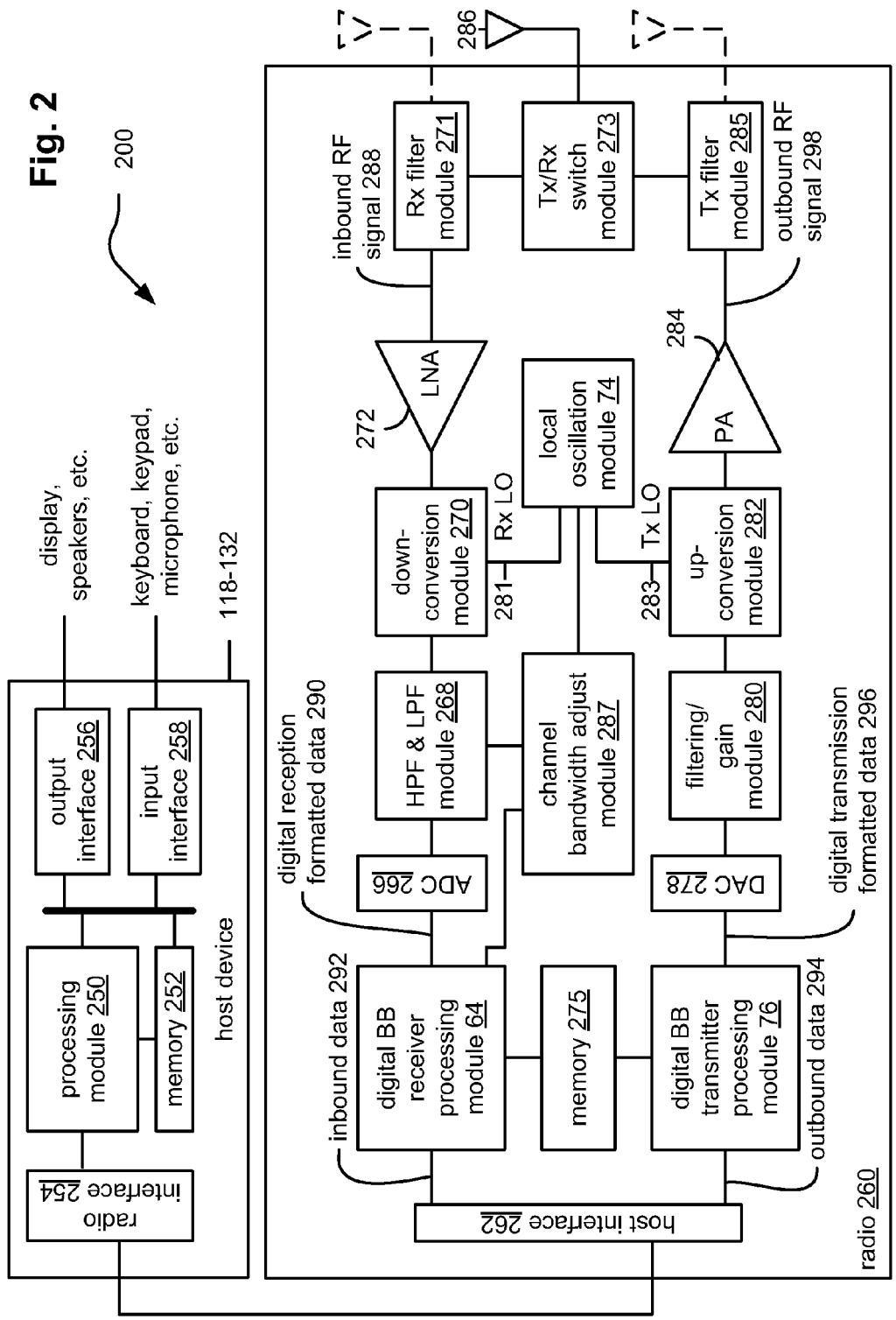
FIG. 2 is a diagram illustrating an embodiment of a wireless communication device.

FIG. 2 is a diagram illustrating an embodiment of a wireless communication device 200 that includes the host device 118-132 and an associated radio 260. For cellular telephone hosts, the radio 260 is a built-in component. For personal digital assistants hosts, laptop hosts, and/or personal computer hosts, the radio 260 may be built-in or an externally coupled component.

As illustrated, the host device 118-132 includes a processing module 250, memory 252, a radio interface 254, an input interface 258, and an output interface 256. The processing module 250 and memory 252 execute the corresponding instructions that are typically done by the host device. For example, for a cellular telephone host device, the processing module 250 performs the corresponding communication functions in accordance with a particular cellular telephone standard.

The radio interface 254 allows data to be received from and sent to the radio 260. For data received from the radio 260 (e.g., inbound data), the radio interface 254 provides the data to the processing module 250 for further processing and/or routing to the output interface 256. The output interface 256 provides connectivity to an output display device such as a display, monitor, speakers, et cetera such that the received data may be displayed. The radio interface 254 also provides data from the processing module 250 to the radio 260. The processing module 250 may receive the outbound data from an input device such as a keyboard, keypad, microphone, et cetera via the input interface 258 or generate the data itself. For data received via the input interface 258, the processing module 250 may perform a corresponding host function on the data and/or route it to the radio 260 via the radio interface 254.

Radio 260 includes a host interface 262, digital receiver processing module 264, an analog-to-digital converter 266, a high pass and low pass filter module 268, an IF mixing down conversion stage 270, a receiver filter 271, a low noise amplifier 272, a transmitter/receiver switch 273, a local oscillation module 274, memory 275, a digital transmitter processing module 276, a digital-to-analog converter 278, a filtering/gain module 280, an IF mixing up conversion stage 282, a power amplifier 284, a transmitter filter module 285, a channel bandwidth adjust module 287, and an antenna 286. The antenna 286 may be a single antenna that is shared by the transmit and receive paths as regulated by the Tx/Rx switch 273, or may include separate antennas for the transmit path and receive path. The antenna implementation will depend on the particular standard to which the wireless communication device 200 is compliant.

The digital receiver processing module 264 and the digital transmitter processing module 276, in combination with operational instructions stored in memory 275, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 264 and 276 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 275 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 264 and/or 276 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 260 receives outbound data 294 from the host device via the host interface 262. The host interface 262 routes the outbound data 294 to the digital transmitter processing module 276, which processes the outbound data 294 in accordance with a particular wireless communication standard (e.g., IEEE 802.11, Bluetooth, ZigBee, any other type of radio frequency based network protocol and/or variations thereof et cetera) to produce outbound baseband signals 296. The outbound baseband signals 296 will be digital base-band signals (e.g., have a zero IF) or digital low IF signals, where the low IF typically will be in the frequency range of one hundred kHz (kilo-Hertz) to a few MHz (Mega-Hertz).

The digital-to-analog converter 278 converts the outbound baseband signals 296 from the digital domain to the analog domain. The filtering/gain module 280 filters and/or adjusts the gain of the analog signals prior to providing it to the IF mixing stage 282. The IF mixing stage 282 converts the analog baseband or low IF signals into RF signals based on a transmitter local oscillation 283 provided by local oscillation module 274. The power amplifier 284 amplifies the RF signals to produce outbound RF signals 298, which are filtered by the transmitter filter module 285. The antenna 286 transmits the outbound RF signals 298 to a targeted device such as a base station, an access point and/or another wireless communication device 200.

The radio 260 also receives inbound RF signals 288 via the antenna 286, which were transmitted by a base station, an access point, or another wireless communication device. The antenna 286 provides the inbound RF signals 288 to the receiver filter module 271 via the Tx/Rx switch 273, where the Rx filter 271 bandpass filters the inbound RF signals 288. The Rx filter 271 provides the filtered RF signals to low noise amplifier 272, which amplifies the signals 288 to produce an amplified inbound RF signals. The low noise amplifier 272 provides the amplified inbound RF signals to the IF mixing module 270, which directly converts the amplified inbound RF signals into an inbound low IF signals or baseband signals based on a receiver local oscillation 281 provided by local oscillation module 274. The down conversion module 270 provides the inbound low IF signals or baseband signals to the filtering/gain module 268. The high pass and low pass filter module 268 filters, based on settings provided by the channel bandwidth adjust module 287, the inbound low IF signals or the inbound baseband signals to produce filtered inbound signals.

The analog-to-digital converter 266 converts the filtered inbound signals from the analog domain to the digital domain to produce inbound baseband signals 290, where the inbound baseband signals 290 will be digital base-band signals or digital low IF signals, where the low IF typically will be in the frequency range of one hundred kHz to a few MHz. The digital receiver processing module 264, based on settings provided by the channel bandwidth adjust module 287, decodes, descrambles, demaps, and/or demodulates the inbound baseband signals 290 to recapture inbound data 292 in accordance with the particular wireless communication standard being implemented by radio 260. The host interface 262 provides the recaptured inbound data 292 to the host device 118-132 via the radio interface 254.

As one of average skill in the art will appreciate, the wireless communication device 200 of FIG. 2 may be implemented using one or more integrated circuits. For example, the host device may be implemented on one integrated circuit, the digital receiver processing module 264, the digital transmitter processing module 276 and memory 275 may be implemented on a second integrated circuit, and the remaining components of the radio 260, less the antenna 286, may be implemented on a third integrated circuit. As an alternate example, the radio 260 may be implemented on a single integrated circuit. As yet another example, the processing module 250 of the host device and the digital receiver and transmitter processing modules 264 and 276 may be a common processing device implemented on a single integrated circuit. Further, the memory 252 and memory 275 may be implemented on a single integrated circuit and/or on the same integrated circuit as the common processing modules of processing module 250 and the digital receiver and transmitter processing module 264 and 276.

Figure 3:
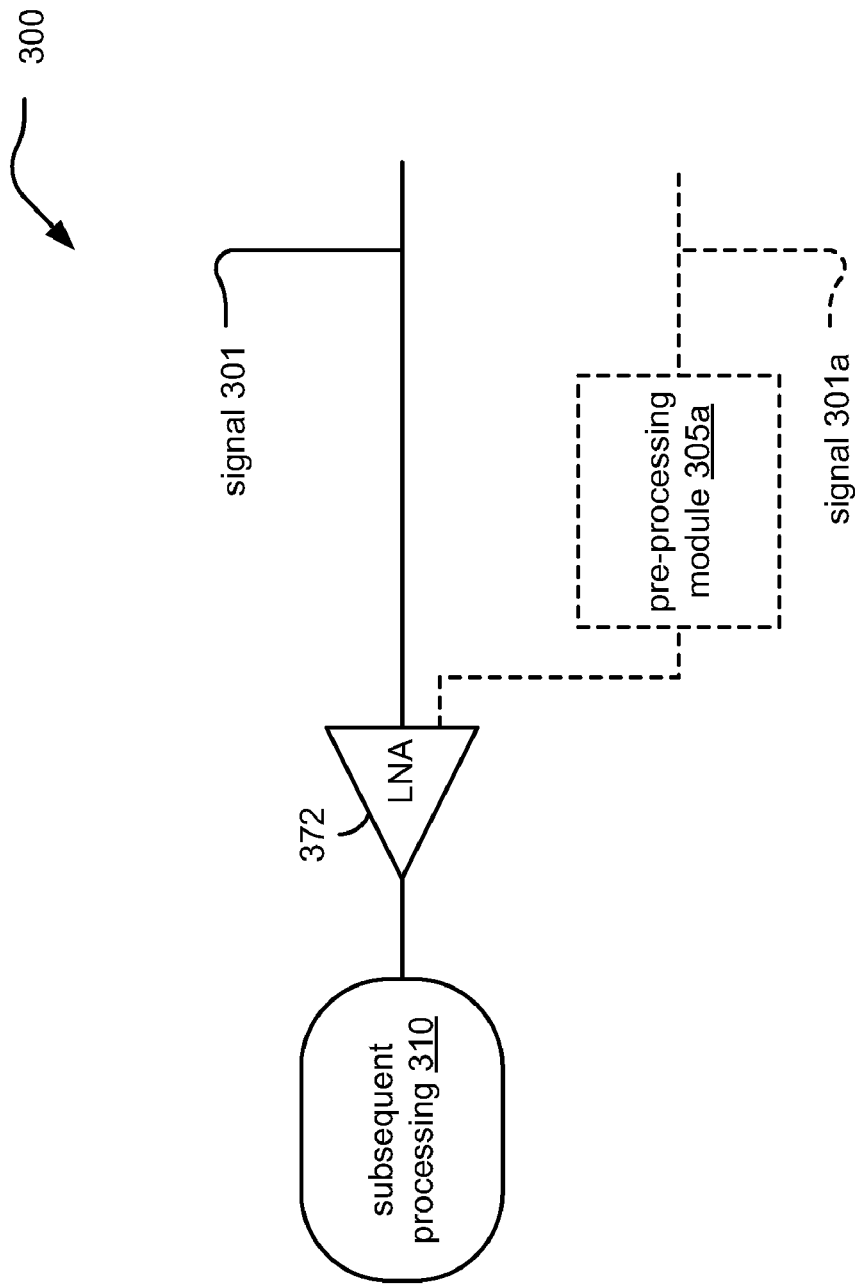
FIG. 3 is a diagram illustrating an embodiment of a portion of a communication device that includes an LNA (Low Noise Amplifier).

FIG. 3 is a diagram illustrating an embodiment 300 of a portion of a communication device that includes an LNA (Low Noise Amplifier) 372. A signal 301 is provided to the LNA 372. In some embodiments, this signal 301 is a signal received via a wireless communication channel. In other embodiments, this signal 301 is a signal provided from another portion of circuitry within a communication device.

Moreover, in an alternative embodiment, a signal 301a can be viewed as being received and undergoing additional processing within a pre-processing module 305a before providing its output to the LNA 372. The pre-processing module 305a can perform a variety of processing operations including scaling (up or down), filtering, frequency conversion (e.g., from a carrier frequency to an intermediate frequency, from an intermediate frequency to a baseband frequency, or generally from a first frequency to a second frequency), digital sampling, digital filtering, etc.

In whichever embodiment employed, a signal (e.g., either signal 301 or output from the pre-processing module 305a) is provided to the LNA 372, and the output of the LNA 372 is provided to one or more subsequent modules and/or functional blocks to perform subsequent processing 310.

It is noted that the general implementation of an LNA, in accordance with certain aspects of the invention presented herein, can be implemented within a broad range of communication devices, and those communication devices can be implemented within a broad range of communication systems.

Figure 4:
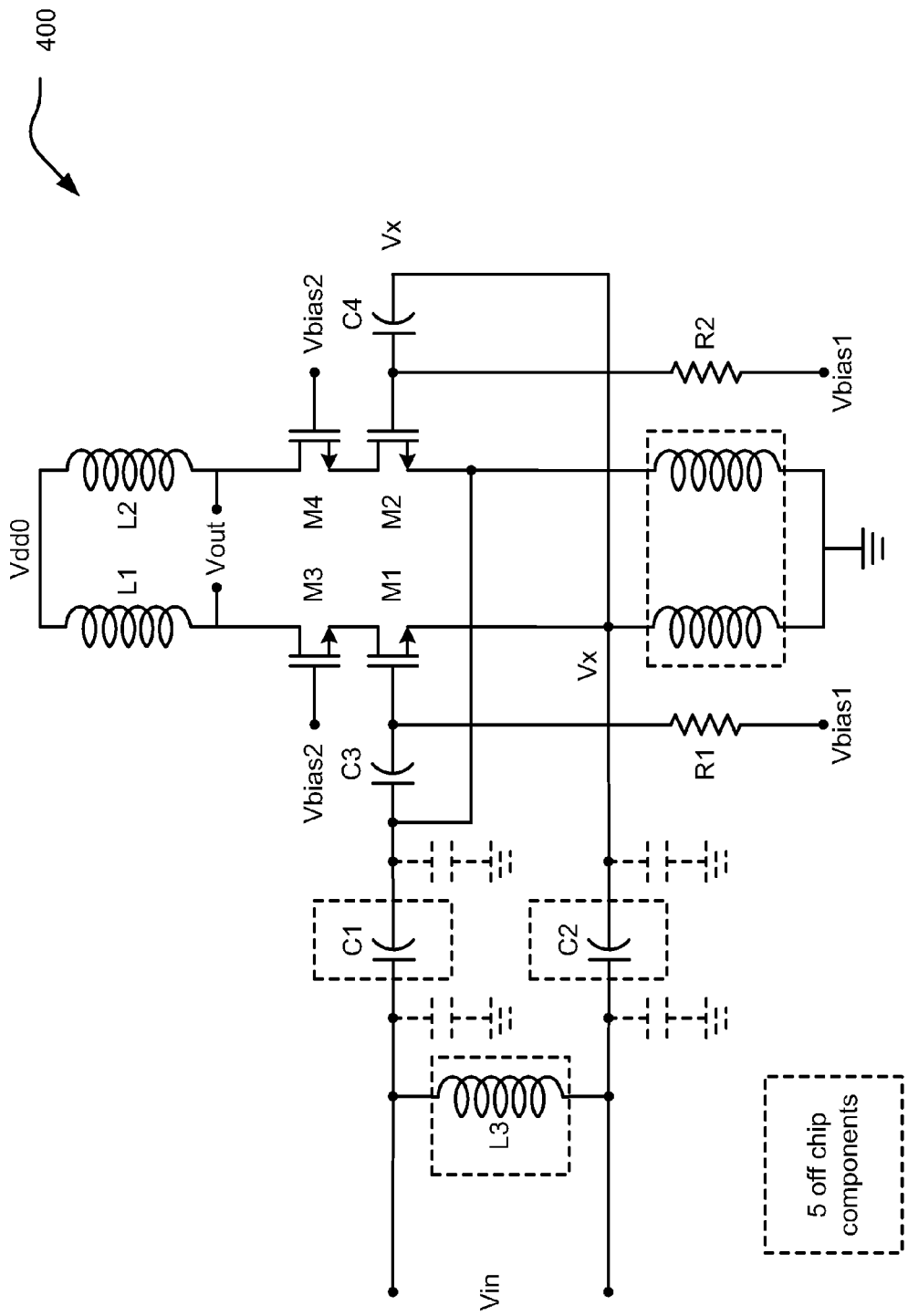
FIG. 4 is a diagram illustrating an embodiment of a prior art implementation of an LNA.

FIG. 4 is a diagram illustrating an embodiment 400 of a prior art implementation of an LNA. The reader is directed to the "DESCRIPTION OF RELATED ART" section with reference to FIG. 4.

FIG. 5 and FIG. 6 are diagrams illustrating embodiments of LNAs.

Referring to the embodiment 500 of FIG. 5, an input voltage, Vin, is provided across an input inductor (L3) and then to two separate capacitors, C1 and C2, which themselves are integrated components (e.g., non off-chip components). The outputs from these two separate capacitors, C1 and C2, are provided to two other capacitors, C3 and C4, and subsequently to the gates of a first pair of triple well connected transistors (M1 and M2) (shown as n-channel metal oxide semiconductor field-effect transistors (N-MOSFETs) in this diagram). A second pair of triple well connected transistors (M3 and M4) (shown also as n-channel metal oxide semiconductor field-effect transistors (N-MOSFETs) in this diagram) is implemented such that the drains of the first pair of triple well connected transistors (M1 and M2) are coupled to the sources of the second pair of triple well connected transistors (M3 and M4).

The gates of the second pair of triple well connected transistors (M3 and M4) are provided a bias voltage level (Vbias2). Two separate resistors, R1 and R2, are connected between the gates of the first pair of triple well connected transistors (M1 and M2) and another bias voltage level (Vbias1). Two separate inductors, L1 and L2, are connected between the drains of the second pair of transistors (M3 and M4) to a power supply voltage level (Vdd1); this Vdd1 can be of a slightly higher voltage level than Vdd0 shown in FIG. 4 for a prior art approach. The slightly higher voltage level (Vdd1) can be employed to accommodate the voltage drop of the source resistors (Rx and Ry). The two source resistors (Rx and Ry) are connected between the sources of the first pair of triple well connected transistors (M1 and M2) to ground. As can also be seen, the node between capacitor, C1, and capacitor, C3, is connected to the source of one transistor (M2) within the first pair of triple well connected transistors (M1 and M2), and the node between capacitor, C2, and capacitor, C4, is connected to the source of the other transistor (M1) within the pair of transistors (M1 and M2). If desired, shunt capacitors can be implemented as well as depicted in the diagram (e.g., using dotted lines). For example, one shunt capacitor can be implemented each of the sides of capacitor, C1, and capacitor, C2, respectively.

Referring to the embodiment 600 of FIG. 6, this embodiment 600 is somewhat analogous to the embodiment 500 of FIG. 5. In this embodiment 600, the source resistors (Rx and Ry) are replaced by a third pair of transistors (M5 and M6) (shown as n-channel metal oxide semiconductor field-effect transistors (N-MOSFETs) in this diagram). This third pair of transistors (M5 and M6) need not be implemented within a triple well, but it can be implemented that way if desired. One embodiment explicitly includes each transistor in this third pair of transistors (M5 and M6) implemented in a non-tri-well configuration such that each of a source of the fifth N-MOSFET and a source of the sixth N-MOSFET is not connected to a substrate of the circuitry. In addition, the gates of the third pair of transistors (M5 and M6) are connected to a bias voltage level (Vbias3). This third pair of transistors (M5 and M6) operates as two current sources to provide high impedance to the sources of the first pair of transistors (M1 and M2).

It is noted that the various modules (e.g., pre-processing module, subsequent processing module, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. An apparatus, comprising:
a low noise amplifier (LNA) including a plurality of on-chip components; and wherein:
the plurality of on-chip components including a plurality of metal oxide semiconductor field-effect transistors (MOSFETs) respectively connected in triple well configuration such that within each of the plurality of MOSFETs, its respective source being connected to its respective substrate,
the plurality of MOSFETs respectively connected in triple well configuration including a first n-channel metal oxide semiconductor field-effect transistor (N-MOSFET) and a second N-MOSFET, and
the LNA further including one off-chip component, the one off-chip component being an off-chip inductor having a first end communicatively coupled to a gate of the first N-MOSFET via a first on-chip capacitor and a second on-chip capacitor and having a second end being communicatively coupled to a gate of the second N-MOSFET via a third on-chip capacitor and a fourth on-chip capacitor.

2. The apparatus of claim 1, wherein:
the plurality of MOSFETs including a third N-MOSFET and a fourth N-MOSFET;
a gate of the third N-MOSFET and a gate of the fourth N-MOSFET biased with a bias voltage;
a drain of the first N-MOSFET connected to a source of the third N-MOSFET; and
a drain of the second N-MOSFET connected to a source of the fourth N-MOSFET; and
a drain of the third N-MOSFET and a drain of the fourth N-MOSFET for providing a differential output signal from the LNA.

3. The apparatus of claim 2, wherein:
the plurality of on-chip components also including:
a first inductor having a first end connected to the drain of the third N-MOSFET and having a second end connected to a power supply; and
a second inductor having a first end connected to the drain of the fourth N-MOSFET and having a second end connected to the power supply.

4. The apparatus of claim 2, wherein:
the plurality of on-chip components also including:
a first resistor having a first end connected to the gate of the first N-MOSFET and having a second end grounded; and
a second resistor having a first end connected to the gate of the second N-MOSFET and having a second end grounded.

5. The apparatus of claim 1, wherein:
a first node at which the first on-chip capacitor and the second on-chip capacitor are connected is also connected to a source of the second N-MOSFET; and
a second node at which the third on-chip capacitor and the fourth on-chip are capacitor connected is also connected to a source of the first N-MOSFET.

6. The apparatus of claim 1, wherein:
the plurality of on-chip components also including:
- a first resistor having a first end connected to a source of the first N-MOSFET and having a second end grounded; and
- a second resistor having a first end connected to a source of the second N-MOSFET and having a second end grounded.

7. The apparatus of claim 1, wherein:
the plurality of on-chip components also including a third N-MOSFET and a fourth N-MOSFET;
a source of the first N-MOSFET connected to a drain of the third N-MOSFET;
a source of the second N-MOSFET connected to a drain of the fourth N-MOSFET; and
a source of the third N-MOSFET and a source of the fourth N-MOSFET grounded.

8. The apparatus of claim 1, wherein:
the apparatus being a wireless communication device.

9. The apparatus of claim 8, wherein:
at LNA being a portion of a radio implemented within wireless communication device.

10. A wireless communication device, comprising:
a low noise amplifier (LNA), being a portion of a radio of the wireless communication device, including a plurality of on-chip components and only one off-chip component; and wherein:
the plurality of on-chip components including a plurality of metal oxide semiconductor field-effect transistors (MOSFETs) respectively connected in triple well configuration such that within each of the plurality of MOSFETs, its respective source being connected to its respective substrate;
the plurality of MOSFETs respectively connected in triple well configuration including a first n-channel metal oxide semiconductor field-effect transistor (N-MOSFET) and a second N-MOSFET; and
the one off-chip component being an off-chip inductor having a first end communicatively coupled to a gate of the first N-MOSFET via a first on-chip capacitor and a second on-chip capacitor and having a second end being communicatively coupled to a gate of the second N-MOSFET via a third on-chip capacitor and a fourth on-chip capacitor.

11. The wireless communication device of claim 10, wherein:
the plurality of MOSFETs also including a third N-MOSFET and a fourth N-MOSFET;
a gate of the third N-MOSFET and a gate of the fourth N-MOSFET biased with a bias voltage;
a drain of the first N-MOSFET connected to a source of the third N-MOSFET; and
a drain of the second N-MOSFET connected to a source of the fourth N-MOSFET; and
a drain of the third N-MOSFET and a drain of the fourth N-MOSFET for providing a differential output signal from the LNA.

12. The wireless communication device of claim 11, wherein:
the plurality of on-chip components also including:
- a first inductor having a first end connected to the drain of the third N-MOSFET and having a second end connected to a power supply; and
- a second inductor having a first end connected to the drain of the fourth N-MOSFET and having a second end connected to the power supply.

13. The wireless communication device of claim 11, wherein:
the plurality of on-chip components also including:
- a first resistor having a first end connected to the gate of the first N-MOSFET and having a second end grounded; and
- a second resistor having a first end connected to the gate of the second N-MOSFET and having a second end grounded.

14. The wireless communication device of claim 10, wherein:
a first node at which the first on-chip capacitor and the second on-chip capacitor are connected is also connected to a source of the second N-MOSFET; and
a second node at which the third on-chip capacitor and the fourth on-chip are capacitor connected is also connected to a source of the first N-MOSFET.

15. A method, comprising:
providing a differential input signal to a low noise amplifier (LNA) including a plurality of on-chip components, wherein:
the plurality of on-chip components including a plurality of metal oxide semiconductor field-effect transistors (MOSFETs) respectively connected in triple well configuration such that within each of the plurality of MOSFETs, its respective source being connected to its respective substrate,
the plurality of MOSFETs respectively connected in triple well configuration including a first n-channel metal oxide semiconductor field-effect transistor (N-MOSFET) and a second N-MOSFET, and
the LNA further including one off-chip component, the one off-chip component being an off-chip inductor having a first end communicatively coupled to a gate of the first N-MOSFET via a first on-chip capacitor and a second on-chip capacitor and having a second end being communicatively coupled to a gate of the second N-MOSFET via a third on-chip capacitor and a fourth on-chip capacitor; and
outputting a differential output signal from the LNA via respective drains of two of the plurality of N-MOSFETs connected in triple well configuration; and
providing the differential input signal to the first end of the off-chip inductor and to the second end of the off-chip inductor.

16. The method of claim 15, further comprising:
biasing a gate of the first N-MOSFET and a gate of the second N-MOSFET biased with a bias voltage; and
outputting the differential output signal via a drain of the first N-MOSFET and a drain of the second N-MOSFET.

17. The method of claim 15, wherein:
the plurality of on-chip components also including a third N-MOSFET and a fourth N-MOSFET;
a source of the first N-MOSFET connected to a drain of the third N-MOSFET;
a source of the second N-MOSFET connected to a drain of the fourth N-MOSFET; and
a source of the third N-MOSFET and a source of the fourth N-MOSFET grounded; and further comprising:
biasing a gate of the third N-MOSFET and a gate of the fourth N-MOSFET biased with a bias voltage.

18. The method of claim 15, wherein:
the method being performed within a wireless communication device.

* * * * *

UNITED STATES PATENT AND TRADEMARK OFFICE
CERTIFICATE OF CORRECTION

PATENT NO. : 8,385,877 B2
APPLICATION NO. : 13/033289
DATED : February 26, 2013
INVENTOR(S) : Yuyu Chang et al.

Page 1 of 1

It is certified that error appears in the above-identified patent and that said Letters Patent is hereby corrected as shown below:

In the Claims

Col. 12, line 16, in claim 14: replace "are capacitor" with --capacitor are--

Signed and Sealed this
Twenty-fourth Day of December, 2013

Margaret A. Focarino
*Commissioner for Patents of the United States Patent and Trademark Office*